(12) United States Patent
Farooq et al.

(10) Patent No.: US 7,470,985 B2
(45) Date of Patent: Dec. 30, 2008

(54) SOLDER CONNECTOR STRUCTURE AND METHOD

(75) Inventors: Mukta G. Farooq, Hopewell Junction, NY (US); Laertis Economikos, Wappingers Falls, NY (US); Ian D. Melville, Highland, NY (US); Kevin S. Petrarca, Newburgh, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 11/461,208

(22) Filed: Jul. 31, 2006

(65) Prior Publication Data
US 2008/0023827 A1    Jan. 31, 2008

(51) Int. Cl.
*H01L 23/48* (2006.01)
*H01L 23/52* (2006.01)

(52) U.S. Cl. ..................... 257/737; 257/738
(58) Field of Classification Search ......... 257/737–738, 257/780
See application file for complete search history.

(56) References Cited

U.S. PATENT DOCUMENTS

| 6,293,457 | B1 * | 9/2001 | Srivastava et al. ........... 228/254 |
| 6,426,557 | B1 | 7/2002 | Daubenspeck et al. |
| 6,730,982 | B2 | 5/2004 | Barth et al. |
| 2007/0232049 | A1 * | 10/2007 | Edelstein et al. ........... 438/612 |

OTHER PUBLICATIONS

U.S. Appl. No. 11/308,539, Edelstein, et al., pending.

* cited by examiner

*Primary Examiner*—Theresa T Doan
(74) *Attorney, Agent, or Firm*—Gibb & Rahman, LLC; Ira D. Blecker, Esq.

(57) ABSTRACT

Disclosed are embodiments of a far back end of the line solder connector and a method of forming the connector that eliminates the use aluminum, protects the integrity of the ball limiting metallurgy (BLM) layers and promotes adhesion of the BLM layers by incorporating a thin conformal conductive liner into the solder connector structure. This conductive liner coats the top of the via filling in any divots in order to create a uniform surface for BLM deposition and to, thereby, protect the integrity of the BLM layers. The liner further coats the dielectric sidewalls of the well in which the BLM layers are formed in order to enhance adhesion of the BLM layers to the well.

11 Claims, 7 Drawing Sheets

SOLDER CONNECTOR STRUCTURE AND METHOD

BACKGROUND

1. Field of the Invention

The embodiments of the invention generally relate to far back end of the line (FBEOL) structures and, more particularly, to FBEOL solder connector structure that incorporates a thin conformal conductive layer to optimize contact and adhesion between ball limiting metallurgy (BLM) layers and a conductive via.

2. Description of the Related Art

Aluminum has generally been removed from chip processing due to the replacement of aluminum with copper in the chip wiring levels. However, conventional far back end of the line (FBEOL) solder connectors are still being formed with a thick aluminum or aluminum alloy pad between the copper via and the ball limiting metallurgy (BLM) layers with which a solder ball connection (e.g., a controlled collapse chip connection (C4)) is made.

As addressed in U.S. patent application Ser. No. 11/308,359, filed on Apr. 4, 2006, and incorporated herein by reference, it would be advantageous over the prior art to remove this thick aluminum pad from the solder connector structure and, thus, to completely eliminate the use of aluminum in chip processing. Specifically, removing the aluminum pad from the connector structure would eliminate an entire process sequence associated with the aluminum level, including deposition, resist and lithography, and reactive ion etching, as well as eliminate the need for a chromium phosphate cleaning process, which presents environmental concerns. Other problems associated with aluminum, include, the fact that is has a low melting point and worse electro-migration characteristics when compared to other metals (e.g., copper). Additionally, elimination of the thick aluminum pad will allow for device scaling, process simplification and cost reductions.

SUMMARY

In view of the foregoing, disclosed herein are embodiments of a far back end of the line solder connector and a method of forming the connector that eliminates the use aluminum, protects the integrity of the ball limiting metallurgy (BLM) layers and promotes adhesion of the BLM layers by incorporating a conformal conductive liner into the solder connector structure.

An embodiment of the solder connector structure of the invention comprises an insulating layer on a substrate. The insulating layer has a first side and a second side. A via extends through the insulating layer from the first side to the second side and can be filled with a conductor. The via can also comprise a plurality of dielectric columns that extend vertically through the conductor.

The connector structure can further comprise a stack of dielectric layers that are adjacent to the second side of the insulating layer. A well with tapered sidewalls extends vertically through this stack to the via such that the bottom of the well comprises the top of the via.

The bottom and tapered sidewalls of the well are lined with a conductive liner. This conductive liner is thin relative to the depth of the well (i.e., relative to the thickness of the stack of dielectric layers). For example, the thickness of the conductive liner can be significantly less than (e.g., less than approximately one-tenth of) the thickness of the stack. This conductive liner can be conformal. That is, the conductive liner conform to the uneven surface at the top of the via. For example, the conductive liner can fill any divots formed in the dielectric columns at the top of the via resulting from the etch processes used to form the well. Additionally, this conductive liner can comprise either a single layer or multiple layers of conductive materials. The conductive material(s) used in the liner can be pre-selected to optimize adhesion of ball limiting metallurgy layers to the sidewalls of the well and/or to allow for simple and cost efficient removal of the conductive liner from the top surface of the stack of dielectric layers following deposition. Specifically, the conductive liner can comprise, for example, one or more layers of tantalum, tantalum nitride, titanium and titanium nitride.

Furthermore, the solder connector structure can comprise a polyimide layer having an opening above the well and a plurality of ball limiting metallurgy layers that conform to the sidewalls of the opening in the polyimide layer as well as to the conductive liner on both the tapered sidewalls and bottom surface of the well.

An embodiment of a method of forming the solder connector structure of the invention comprises forming an insulating layer with a first side and a second side on a semiconductor wafer. A via is formed that extends vertically through the insulating layer from the first side to the second side. The via is filled with a conductor and, optionally, a plurality of vertical dielectric columns that extend vertically through the conductor.

After the via is formed, a stack of dielectric layers are formed on the second side of the insulating layer. A well is formed that extends vertically through the stack, has tapered sidewalls, and exposes the via. Thus, the bottom of the well comprises the top of the via. However, if the via is formed with dielectric columns, divots may also be formed in the top of the via as a result of the etch process used to form the well and, specifically, as a result of the different etch rates between the conductor and the dielectric columns. These divots create an uneven (i.e., non-uniform) surface at the top of the via.

Once the well is formed, a conductive liner with one or more layers of conductive material is formed on the bottom and sidewalls of the well. The conductive liner is formed so that it is thin relative to the depth of the well (i.e., relative to the thickness of the stack of dielectric layers). For example, the conductive liner can be formed with a thickness that is significantly less than (e.g., less than approximately one-tenth of) the thickness of the stack. This conductive liner can also formed so that it conforms to the top surface of the via. Specifically, the conductive liner can be formed so that it conforms to the entire uneven surface at the top of the via, thereby, filling in any divots created during well formation.

In order to form this conductive liner, the conductive material that will be used to form the liner is pre-selected. The conductive material can be pre-selected to optimize adhesion of the subsequently formed ball limiting metallurgy layers to the sidewalls of the well and/or to allow for simple and cost efficient removal from the top surface of the stack of dielectric layers following deposition. Suitable conductive materials can include, but are not limited to, tantalum, tantalum nitride, titanium and titanium nitride. Once the conductive material is selected, the liner is deposited (e.g., by sputtering) over the stack and the well.

After the conductive liner is deposited, it is selectively removed from the top surface of the stack of dielectric layers so that the liner remains only on the bottom surface and tapered sidewalls of the well.

Then, a polyimide layer is formed over the stack of dielectric layers and in the well on the conductive liner. An opening is formed in the polyimide layer to expose the well and, specifically, to expose the conductive liner on the bottom and sidewalls of the well.

After the opening is formed in the polyimide layer, ball limiting metallurgy layers are deposited so that they conform to the top surface of the polyimide, the sidewalls of the polyimide opening, and the conductive liner on the bottom and sidewalls of the well.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS OF THE INVENTION

Figure 1:
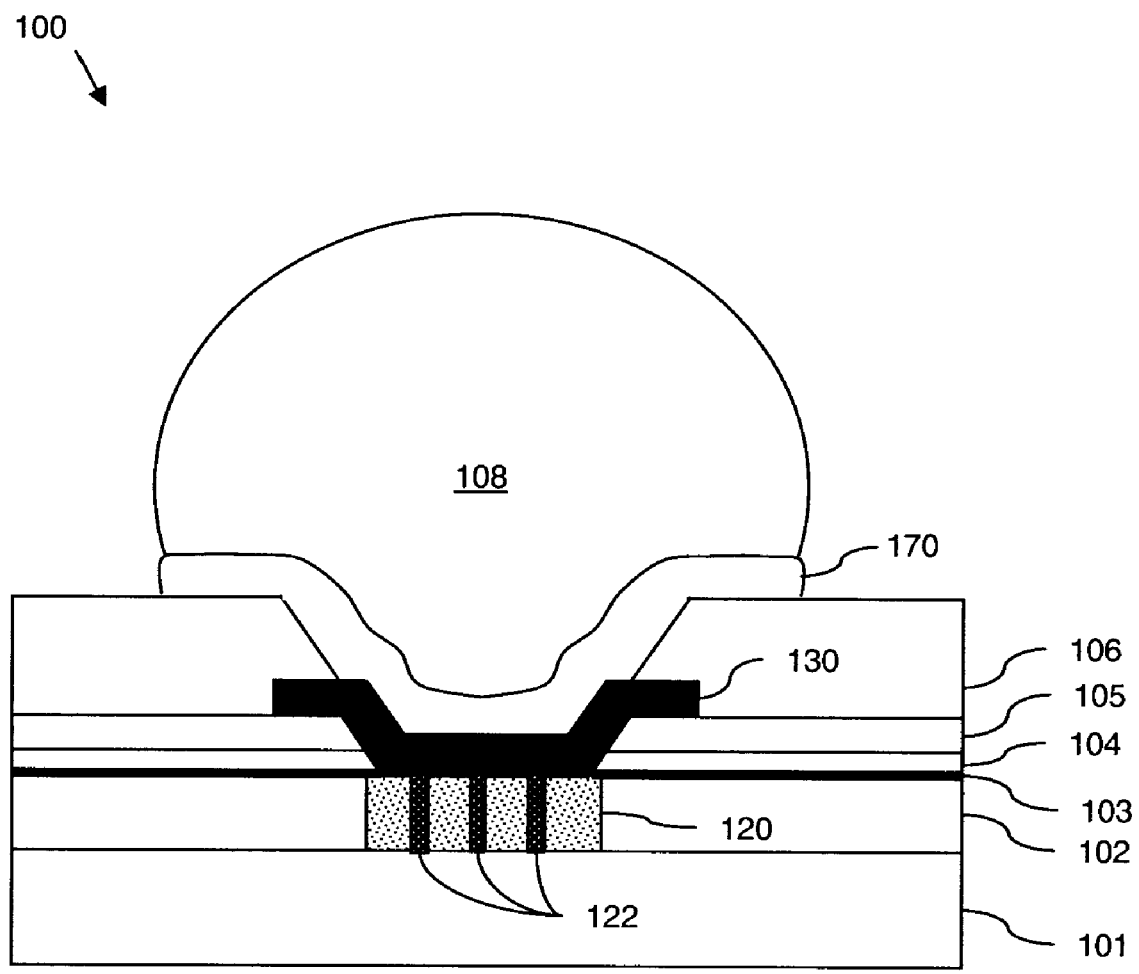
FIG. 1 is a schematic diagram illustrating a solder connector structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Aluminum has generally been removed from chip processing due to the replacement of aluminum with copper in the chip wiring levels. However, conventional far back end of the line (FBEOL) solder connectors are still being formed with a thick aluminum or aluminum alloy pad between the copper via and the ball limiting metallurgy (BLM) layers with which a solder ball connection (e.g., a controlled collapse chip connection (C4)) is made. Specifically, referring to FIG. 1, conventional FBEOL solder connections 100 generally comprise a copper via 120 through an insulating layer 102 on a semiconductor wafer 101. The copper via 120 is often "cheesed" for strength (i.e., the via 120 may comprise a plurality of vertically oriented oxide columns 122 that extend through the copper). The copper via 120 provides an electrical connection to the devices (not shown) in the semiconductor wafer 101. Above the insulating layer 120 is a stack of dielectric layers, which may include, but is not limited to, a cap layer 103, an oxide layer 104 and a nitride layer 105. The stack of dielectric layers 103-105 is below a polyimide layer 106. An aluminum pad 130 rests above the copper via 120 within a well in the polyimide layer 106 and stack of dielectric layers 103-105. The aluminum pad 170 supports ball limiting metallurgy (BLM) layers 170 on which the solder ball 108 rests. As discussed above, it would be advantageous to completely remove aluminum from chip processing.

Figure 2:
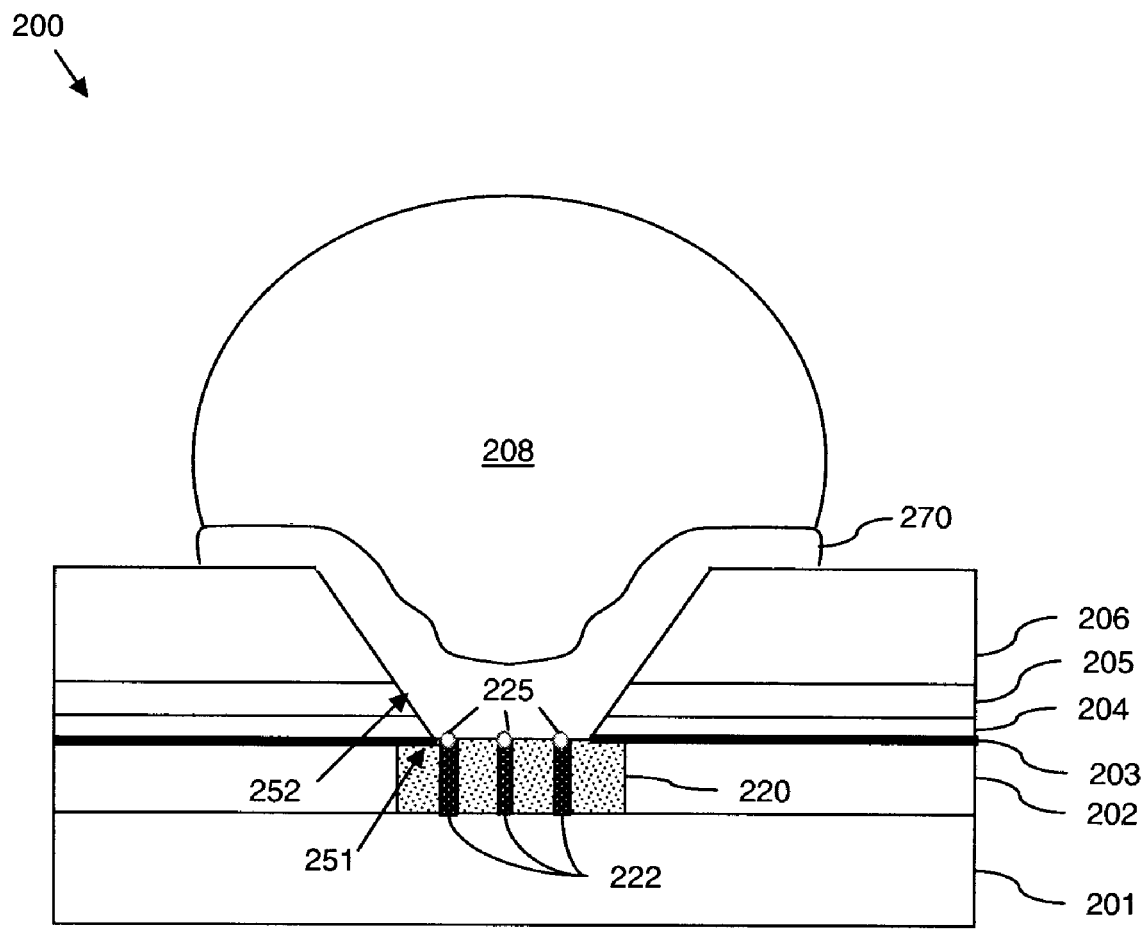
FIG. 2 is a schematic diagram illustrating another solder connector structure.

U.S. patent application Ser. No. 11/308,359, referenced above, discloses a solder connector structure in which the thick aluminum pad is completely eliminated from the solder connector structure. Specifically, U.S. patent application Ser. No. 11/308,359 discloses a solder connector structure and method of forming the structure without an aluminum pad. As illustrated in FIG. 2, a FBEOL solder connections 200 without the aluminum pad comprises a copper via 220 through an insulating layer 202 on a semiconductor wafer 201. As with the structure 100, the copper via 220 can be "cheesed" for strength (i.e., the via 220 may comprise a plurality of vertically oriented oxide columns 222 that extend through the copper). Above the insulating layer 220 is a stack of dielectric layers, which may include, but is not limited to, a cap layer 203, an oxide layer 204 and a nitride layer 205. The stack of dielectric layers 203-205 is below a polyimide layer 206. The ball limiting metallurgy (BLM) layers 270 rest directly on the copper via 220 and the solder ball 208 rests on the BLM layers 270.

However, processes used to form the structure 200 of FIG. 2 can create an uneven surface 251 at the top of the via 220 (i.e., at the bottom surface of the well). More specifically, as the cap layer 203 is etched, the top of the via 200 is exposed to a plasma etch process (e.g., $CF_4$, $CHF_3$ or Ar reactive ion etch (RIE) processes). This plasma etch process is followed by an $O_2$ plasma ash process as well as a pre-BLM deposition backsputter clean process. Exposure of the top surface of the via to these processes can create divots 225 in the surface of the dielectric columns 222, due to the different etch rates between the dielectric material in the columns and the copper conductor. The uneven (i.e., non-uniform) surface 251 of the via 220 can cause a breakage of the BLM layers 270 in some instances because of gaps created by the divots 225 during deposition. This breakage can lead to a failure in the integrity of the final FBEOL structure, once the solder is deposited and joined. That is, the solder may penetrate the copper via and, thereby, cause a failure. Additionally, the ability of the BLM layers 270 to adhere directly to polyimide 206 (particularly, a photosensitive polyimide (PSPI)) and dielectrics 303-305 is less than ideal.

In view of the foregoing, disclosed herein are embodiments of a far back end of the line solder connector and a method of forming the connector that eliminates the use aluminum, protects the integrity of the ball limiting metallurgy (BLM) layers and promotes adhesion of the BLM layers by incorporating a thin conformal conductive liner into the solder connector structure. Specifically, this conductive liner coats the top of the via, filling in any divots to create a uniform surface for BLM deposition and to, thereby, protect the integrity of the BLM layers. The liner further coats the dielectric sidewalls of the well in which the BLM layers are formed in order to enhance adhesion of the BLM layers to the well and, thereby, greatly improve the robustness and strength of the contact.

Figure 3:
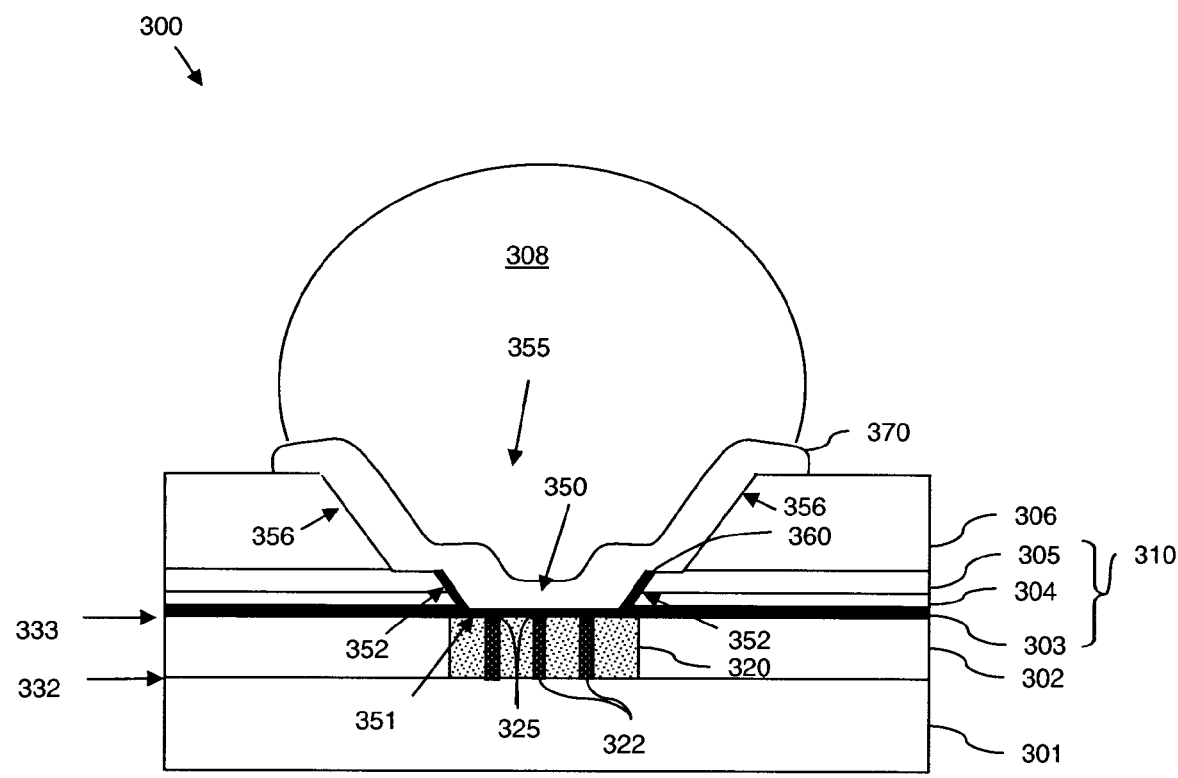
FIG. 3 is a schematic diagram illustrating an embodiment of the solder connector structure of the invention.

Referring to FIG. 3, an embodiment of the solder connector structure 300 of the invention comprises an insulating layer 302 on a substrate 301 (i.e., a semiconductor wafer which comprises a plurality of devices (not shown)). The insulating layer 302 can, for example, comprise a fluorine-doped tetra-ethyl-ortho-silicide (FTEOS) or a fluorosilicate glass (FSG). The insulating layer 302 has a first side 332 adjacent to the substrate 301 and a second side 333. A via 320 extends vertically through the insulating layer 302 from the first side 332 to the second side 333 and is filled with a conductor (e.g., copper). The via 320 can also comprise a plurality of dielectric columns 322 (e.g., oxide columns) that extend vertically through the conductor within the via 320.

The connector structure 300 can further comprise a stack 310 of dielectric layers that are adjacent to the second side 332 of the insulating layer 302. This stack 310 can comprise, for example, a thin cap layer 303, an oxide layer 304 and a nitride layer 305. The thin cap layer 303 is adjacent to the insulating layer 302. The cap layer 303 can comprise, for example, a low-k hard mask material that serves as a chemical mechanical polishing stop material (e.g., a nitrogen doped hydrogenated silicon carbine (SiCHN)) and can have a thickness of approximately 1000 Å thick. The oxide layer 304 can comprise, for example, a silicon dioxide ($SiO_2$) film and can have a thickness of approximately 4500 Å. The nitride layer 305 can comprise a silicon nitride ($Si_3N_4$) film and can have a thickness of approximately 4500 Å. Thus, the combined thickness of the stack 310 can be approximately 10,000 Å.

A well 350 (i.e., a microsocket) with tapered sidewalls 352 extends vertically through this stack 310 to the via 320 such that the bottom of the well comprises the top of the via (see surface 351).

The bottom 351 and tapered sidewalls 352 of the well 350 are lined with a conductive liner 360. This conductive liner 360 is thin relative to the depth of the well 350 (i.e., relative to the thickness of approximately 10,000 Å of the stack of dielectric layers). For example, the thickness of the conductive liner 360 can be significantly less than the thickness of the stack 310. For example, the thickness of the conductive liner 360 can be less than approximately one-tenth that of the stack (e.g., 500-800 Å). This conductive liner 360 can be conformal. That is, the conductive liner 360 conforms to (i.e., fills) the uneven surface at the top 351 of the via 320. For example, the conductive liner 360 can fill any divots 325 formed in the dielectric columns 322 at the top 351 of the via 320 resulting from the etch processes used to form the well and, specifically, divots 325 resulting from the different etch rates between the dielectric columns 322 and the conductor in the via 320, as discussed above. Additionally, this conductive liner 360 can comprise either a single layer of conductive material or multiple layers of conductive materials. The conductive material(s) used in the liner can be pre-selected to optimize adhesion of ball limiting metallurgy layers 370 to the sidewalls 352 of the well 350 and/or to allow for simple and cost efficient removal of the conductive liner 360 from the top surface 333 of the stack 310 of dielectric layers following deposition. Specifically, the conductive liner 360 can comprise, for example, one or more layers of tantalum (Ta), tantalum nitride (TaN), titanium (Ti) and/or titanium nitride (TiN).

Furthermore, the solder connector structure 300 can comprise a polyimide layer 306 having an opening 355 above the well 360. This polyimide layer 306 can comprise, for example, either a photosensitive polyimide (PSPI) layer or a non-photosensitive polyimide layer. Those skilled in the art will recognize that a PSPI layer does not require the use of an additional photo-resist to pattern it, whereas a non-photosensitive polyimide layer does.

The structure 300 can also comprise a plurality of ball limiting metallurgy layers 370 that conform to the sidewalls 356 of the opening 355 in the polyimide layer 306 as well as to the conductive liner 360 on both the tapered sidewalls 352 and bottom 351 of the well 350 in the stack 310 of dielectric layers. These BLM layers 370 can comprise, for example, a 1650 Å titanium tungsten (TiW) layer, a 1800 Å chromium copper (CrCu) layer on the TiW layer, and a 4300 Å copper layer on the CrCu layer. These BLM layers 370 can alternatively comprise, for example, a 1000 Å titanium tungsten (TiW) layer, a 10,000 Å nickel (Ni) layer on the TiW layer, and a 2000 Å copper layer on the Ni layer. However, any other suitable combination of BLM layers 370 or BLM technology may be used. Finally, the structure 300 can comprise a solder ball 308 (e.g., 97% lead (Pb) and 3% tin (Sn), or 97.7% Sn and 2.3% Ag, or any other suitable solder composition) on the BLM layers 370.

Figure 4:
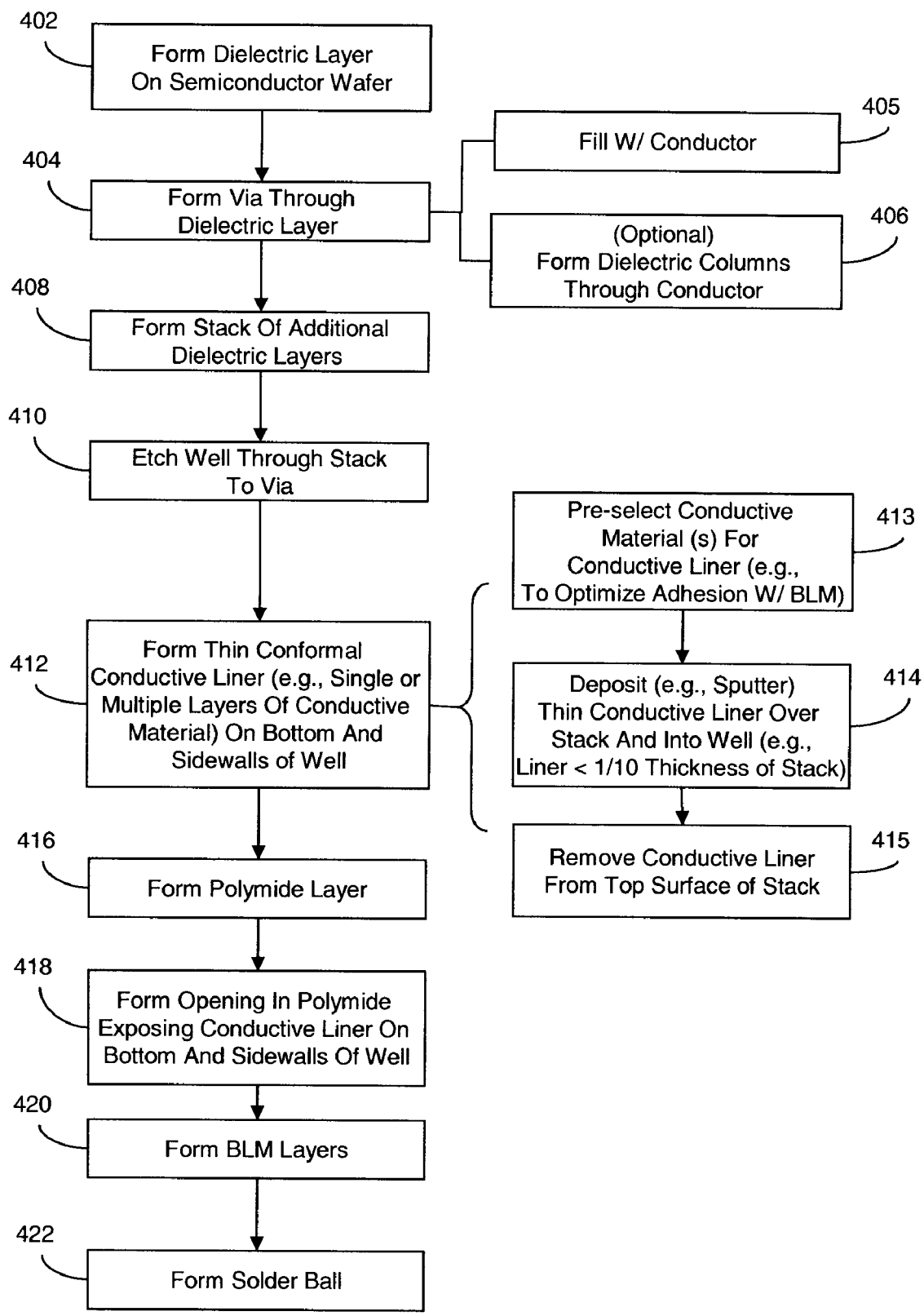
FIG. 4 is a flow diagram illustrating an embodiment of a method of the invention.
Figure 5:
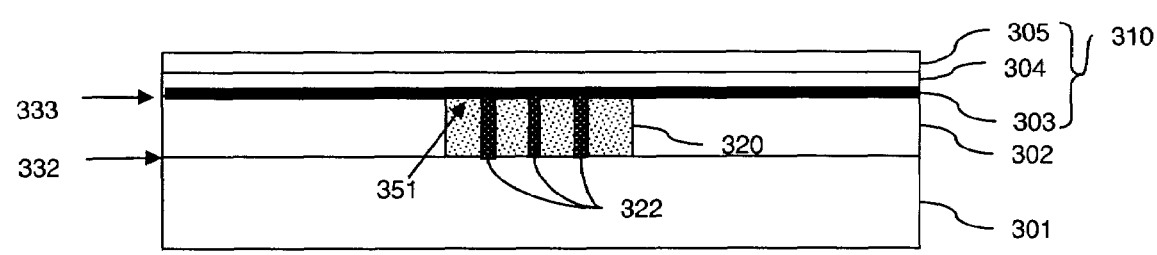
FIG. 5 is a schematic diagram illustrating partially completed solder connector structure.

Referring to FIG. 4, an embodiment of a method of forming the solder connector structure 300 of FIG. 3 comprises forming an insulating layer 302 (e.g., a fluorine-doped tetra-ethyl-ortho-silicide (FTEOS) layer or a fluorosilicate glass (FSG) layer with a first side 332 and a second side 333 on a semiconductor wafer 301 (402, see FIG. 5).

Using conventional processing techniques, a via 320 is formed that extends vertically through the insulating layer 302 from the first side 332 to the second side 333 (404). The via is filled with a conductor (405). For example, the via 320 can be lined with a conductive liner and, then, filled with copper (Cu) using an electroplating process. Optionally, a plurality of vertical dielectric columns 322 (e.g., silicon dioxide (SiO2) columns) can be formed through the conductor within the via 320 (406).

After the via 320 is formed, the second side 333 of the insulating layer 302 and the top 351 of the via 320 can be planarized and a stack 310 of dielectric layers are formed on the second side 333 of the insulating layer 306 (408). For example, a thin cap layer 303 can be deposited adjacent to the insulating layer 302. The cap layer 303 can comprise, for example, a low-k hard mask material that serves as a chemical mechanical polishing stop material (e.g., a nitrogen doped hydrogenated silicon carbine (SiCHN)) and can have a thickness of approximately 1000 Å thick. Then, an oxide layer 304 (e.g., a silicon dioxide ($SiO_2$) film having a thickness of approximately 4500 Å) can be deposited on the cap layer 303. Finally, a nitride layer 305 (e.g., a silicon nitride ($Si_3N_4$) film having a thickness of approximately 4500 Å) can be deposited on the oxide layer 304. Thus, the combined thickness of the stack can be approximately 10,000 Å.

Figure 6:
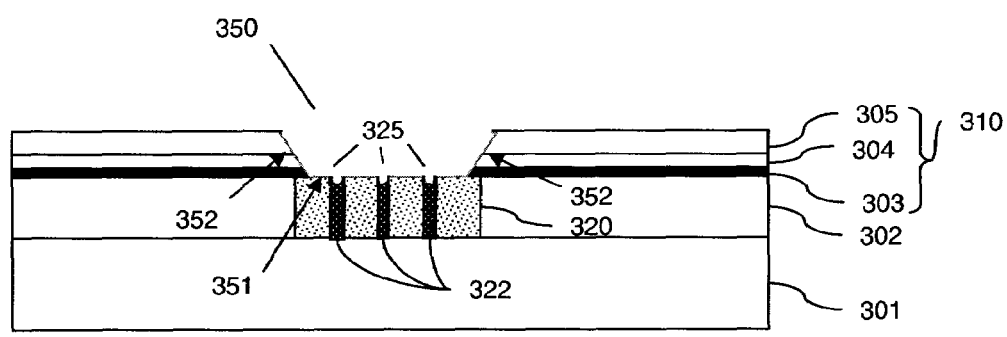
FIG. 6 is a schematic diagram illustrating partially completed solder connector structure.

Then, a well 350 (i.e., a microsocket) can be formed in the stack 310 over the via 320 (410, see FIG. 6). Specifically, a well 350 can be formed that extends vertically through the stack 310, has tapered sidewalls 351 and exposes the top of the via. Thus, the surface 351 at the bottom of the well 350 comprises the top of the via 320. To form the well 350, a photoresist layer can be deposited and lithographically patterned. Then, the well 350 can be etched using, for example, a carbon tetra-fluoride ($CF_4$) reactive ion etch process to remove all layers 303-305 of the stack 310 above the via, including the cap layer 303. The reactive ion etch process may also employ one or more other agents, for example, carbon hydrogen tri-fluoride ($CHF_3$), oxygen ($O_2$), argon (Ar). However, as mentioned above with regards to structure 200 of FIG. 2, if the via 320 is formed with dielectric columns 322 in the conductor, divots 325 may also be formed in the top 351 of the via as a result of the RIE process used to form the well and an $O_2$ plasma ash process. Specifically, the divots 325 are the result of the different etch rates between the conductor and the dielectric in the columns within the via 320. The divots 325 create an uneven (i.e., non-uniform) surface 351 at the top of the via 320.

Figure 7:
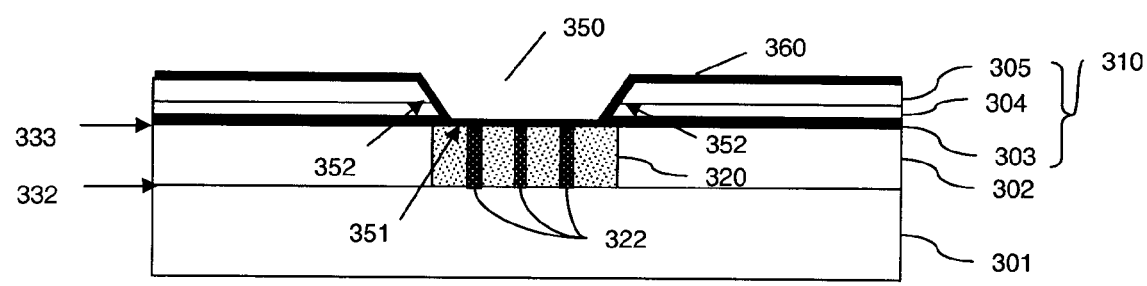
FIG. 7 is a schematic diagram illustrating partially completed solder connector structure.
Figure 8:
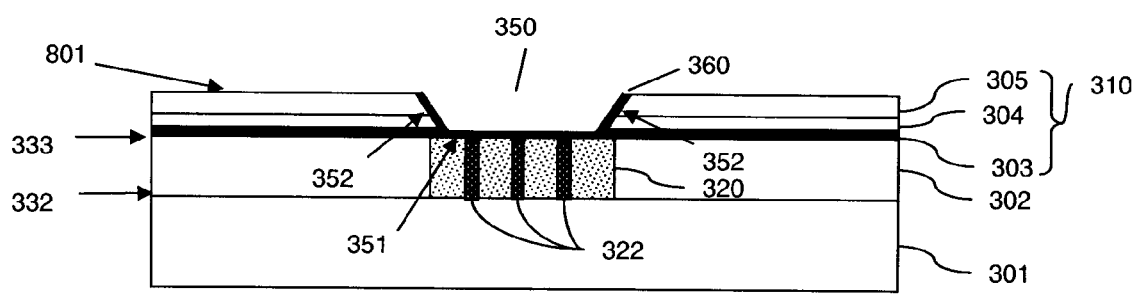
FIG. 8 is a schematic diagram illustrating partially completed solder connector structure.

Therefore, once the well 350 is formed, a conductive liner 360 with one or more layers of conductive material is formed on the bottom surface 351 and tapered sidewalls 352 of the well 350 (412-415, see FIGS. 7-8). The conductive liner 360 is formed so that it is thin relative to the depth of the well (i.e., relative to the thickness of the stack of dielectric layers). The conductive liner 360 can be formed with a thickness that is significantly less than the thickness of the stack. For example, the thickness of the conductive liner 360 can be less than approximately one-tenth that of the stack 310 (e.g., approximately 500-800 Å). This conductive liner 360 can also be formed so that it conforms to the top surface 351 of the via (i.e., the bottom surface of the well). Specifically, the conductive liner 360 can be formed so that it conforms to the entire uneven surface at the top of the via, thereby, filling in any divots 325 created during the well formation process.

In order to form this conductive liner, the conductive material that will be used to form the liner is pre-selected (413). The conductive material can be pre-selected to optimize adhesion of the subsequently formed ball limiting metallurgy layers to the sidewalls 352 of the well and/or to allow for simple and cost efficient removal from the top surface of the stack of dielectric layers following deposition. Suitable conductive materials can include, but are not limited to, tantalum (Ta), tantalum nitride (TaN), titanium (Ti) and/or titanium nitride (TiN). Unlike aluminum (Al), these materials are not soft and do not smear easily. Therefore, they may be removed using chemical mechanical or electrochemical process as opposed to more complex and costly lithographic plus etch processes at process 415, discussed below.

Once the conductive material is selected, the liner is deposited (e.g., by sputtering) over the stack and the well (414, see FIG. 7). Sputtering of the liner material ensures that the liner will conform to the entire uneven surface at the top of the via. Sputtering also allows for easy deposition of multiple different conductive layers. For example, a first layer of tantalum can be formed and then, a second layer of tantalum nitride can be formed by adding nitrogen into the sputtering process. Similarly, a first layer of titanium can be formed and then, a second layer of titanium nitride can be formed by adding nitrogen into the sputtering process. After the conductive liner is deposited at process 414, it is selectively removed from the top surface 801 of the stack 310 of dielectric layers so that the liner 360 remains only on the bottom surface 351 and tapered sidewalls 352 of the well 350 (415, see FIG. 8).

As mentioned above, the conductive liner materials can be pre-selected at process 413 to allow for simple and cost efficient removal from the top surface 801 of the stack 310 of dielectric layers following deposition. Unlike aluminum (Al), tantalum (Ta), tantalum nitride (TaN), titanium (Ti) and titanium nitride (TiN) are not soft and do not smear easily. Therefore, they may be easily removed from the top surface of the stack using any suitable chemical mechanical or electro-chemical process as opposed to more complex and costly lithographic plus etch processes. For example, the conductive liner can be removed from the top surface of the stack at process 415 by a low down force chemical mechanical polishing which does not bend the polishing pad and, thus, the pad does not come into contact with conductive liner within the well. Alternatively, this process 415 may be accomplished by an electrochemical removal process in which a thin protective film is deposited over the entire wafer. Then, pad friction removes the protective film from the top 801 of the stack, while it remains in tact in the well 350. The top 801 of the stack 310 is electro-polished. At the end of the process, the protective film in the recessed areas is removed by reverse bias or chemical rinsing. Process 415 may also be accomplished by machining, micromilling or any other similar cost-efficient process that does not remove any of the liner from within the well.

Figure 9:
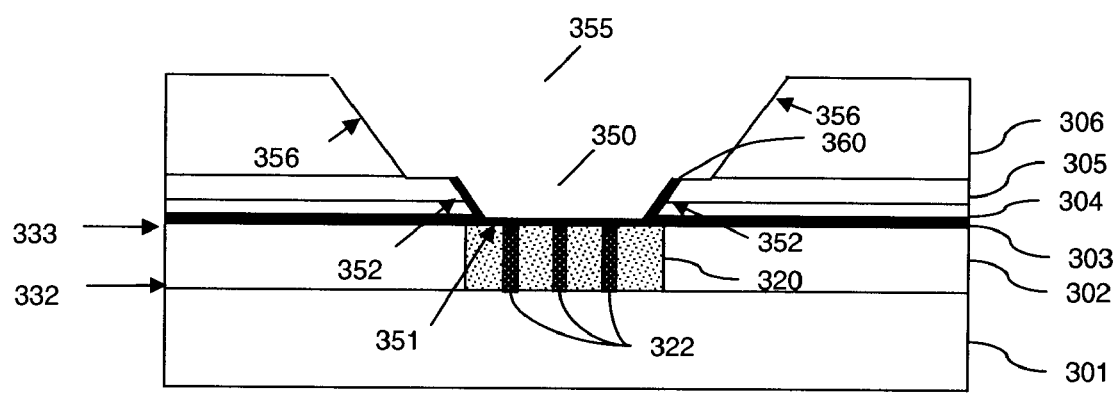
FIG. 9 is a schematic diagram illustrating partially completed solder connector structure.

Once the conductive liner 360 is removed from the top 801 of the stack 310 at process 415, a polyimide layer 306 is formed (e.g., spun-on) over the stack 310 of dielectric layers and in the well 350 on the conductive liner 360 (416). This polyimide layer 306 can be formed, for example, using either a photosensitive polyimide (PSPI) layer or a non-photosensitive polyimide layer. Then, an opening 355 is formed (e.g., using convention lithographic processes) in the polyimide layer 306 to expose the well 350 and, specifically, to expose the conductive liner 360 on the bottom 351 and sidewalls 352 of the well 350 (418, see FIG. 9). As mentioned above, those skilled in the art will recognize that a PSPI layer does not require use of additional photo-resist to pattern it, whereas a non-photosensitive polyimide layer does.

After the opening is formed in the polyimide layer 306 at process 418, ball limiting metallurgy (BLM) layers 370 are formed so that they conform to the top surface of the polyimide 306, the sidewalls 356 of the polyimide opening 355, and the conductive liner 360 on the bottom 351 and sidewalls 352 of the well 350 (420). These BLM layers 370 can be formed by depositing, for example, a 1650 Å titanium tungsten (TiW) layer, a 1800 Å chromium copper (CrCu) layer on the TiW layer, and a 4300 Å copper layer on the CrCu layer. However, any other suitable combination of BLM layers 370 or BLM technology may be used.

Figure 10:
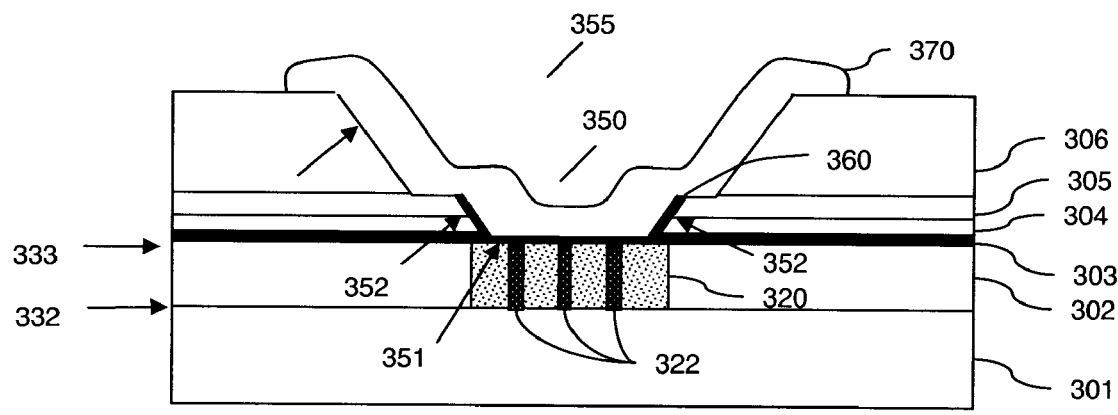
FIG. 10 is a schematic diagram illustrating partially completed solder connector structure.

Then, a photo-resist stencil is created such that the microsocket is opened, exposing the BLM layers above the via 320. This is followed by a plating process, where a solder ball 308 (e.g., a C4 bump comprising 97% lead (Pb) and 3% tin (Sn) or a solder ball comprising any other suitable solder composition) is formed on the exposed BLM layers 370 (422, see FIG. 3). The BLM layers 370 are further etched to remove excess BLM material from the top surface of the polyimide 306 around the opening 355 in order to limit the size of the subsequently formed solder ball 308 (see FIG. 10).

Therefore, disclosed above are embodiments of a far back end of the line solder connector and a method of forming the connector that eliminates the use aluminum, protects the integrity of the ball limiting metallurgy (BLM) layers and promotes adhesion of the BLM layers by incorporating a thin conformal conductive liner into the solder connector structure. Specifically, this conductive liner coats the top of the via, filling in any divots to create a uniform surface for BLM deposition and functioning as a diffusion barrier. Thus, the conductive liner promotes BLM integrity and prevents the interdiffusion of the solder and the underlying conductor (e.g., copper) within the via. The liner further coats the dielectric sidewalls of the well in which the BLM layers are formed in order to enhance adhesion of the BLM layers to the well and, thereby, greatly improve robustness and strength of the contact.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A non-aluminum solder connector structure comprising:
   an insulating layer with a first side and a second side;
   a via extending through said insulating layer from said first side to said second side;
   a conductor filling said via, wherein a top of said via on said second side comprises an uneven surface;
   a stack of dielectric layers adjacent to said second side, said stack of dielectric layers having a top surface;
   a well extending through said stack of dielectric layers to said via, wherein said well has a bottom and sidewalls and wherein said bottom of said well comprises said top of said via;
   a conductive liner within said well only on said bottom and on said sidewalls, wherein said conductive liner conforms to said uneven surface of said top of said via and wherein a first thickness of said conductive liner is less than approximately one tenth a second thickness of said stack; and
   a polymide layer immediately adjacent to said top surface of said stack of dielectric layers, wherein no portion of said conductive liner is positioned between said top surface of said stack of dielectric layers and said polymide layer.

2. The solder connector structure of claim 1, further comprising:
   an opening extending through said polymide layer to said well, said opening exposing said conductive liner and further exposing a portion of said top surface of said stack of dielectric layers surrounding said opening; and
   a plurality of ball limiting metallurgy layers on said conductive liner and on said portion of said top surface of said stack of gate dielectric layers surrounding said opening, wherein said conductive liner is pre-selected to optimize adhesion of said ball limiting metallurgy layers to said sidewalls.

3. The solder connector structure of claim 1, wherein said conductive liner comprises a single layer of conductive material.

4. The solder connector structure of claim 1, wherein said conductive liner comprises multiple layers of conductive material.

5. The solder connector structure of claim 1, wherein said conductive liner comprises at least one of a tantalum layer, a tantalum nitride layer, a titanium layer and a titanium nitride layer.

6. A non-aluminum solder connector structure comprising:
   an insulating layer with a first side and a second side;
   a via extending through said insulating layer from said first side to said second side;
   a conductor filling said via;
   a plurality of dielectric columns extending vertically through said conductor, wherein a top of said via on said second side comprises an uneven surface;
   a stack of dielectric layers on said second side, said stack of dielectric layers having a top surface;
   a well extending vertically through said stack of dielectric layers to said via, wherein said well has a bottom and sidewalls and wherein said bottom of said well comprises said top of said via;
   a conductive liner within said well only on said bottom and said sidewalls, wherein said conductive liner conforms to said uneven surface of said top of said via; and
   a polymide layer immediately adjacent to said top surface of said stack of dielectric layers, wherein no portion of said conductive liner is positioned between said top surface of said stack of dielectric layers and said polymide layer.

7. The solder connector structure of claim 6, wherein a first thickness of said conductive liner is less than approximately one tenth a second thickness of said stack.

8. The solder connector structure of claim 6, further comprising:
   an opening extending through said polymide layer to said well, said opening exposing said conductive liner and further exposing a portion of said top surface of said stack of dielectric layers surrounding said opening; and
   a plurality of ball limiting metallurgy layers on said conductive liner and on said portion of said top surface of said stack of gate dielectric layers surrounding said opening, wherein said conductive liner is pre-selected to optimize adhesion of said ball limiting metallurgy layers to said sidewalls.

9. The solder connector structure of claim 6, wherein said conductive liner comprises a single layer of conductive material.

10. The solder connector structure of claim 6, wherein said conductive liner comprises multiple layers of conductive material.

11. The solder connector structure of claim 6, wherein said conductive liner comprises at least one of a tantalum layer, a tantalum nitride layer, a titanium layer and a titanium nitride layer.

* * * * *